US007078700B2

(12) United States Patent
Chandhok et al.

(10) Patent No.: US 7,078,700 B2
(45) Date of Patent: Jul. 18, 2006

(54) OPTICS FOR EXTREME ULTRAVIOLET LITHOGRAPHY

(75) Inventors: Manish Chandhok, Beaverton, OR (US); Bryan J. Rice, Hillsboro, OR (US); Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 10/883,048

(22) Filed: Jun. 30, 2004

(65) Prior Publication Data

US 2006/0000985 A1    Jan. 5, 2006

(51) Int. Cl.
*G03F 7/20* (2006.01)
*G03F 9/00* (2006.01)

(52) U.S. Cl. ............... 250/363.1; 250/504 R; 250/461.1; 250/370.09

(58) Field of Classification Search ............. None
See application file for complete search history.

(56) References Cited

U.S. PATENT DOCUMENTS

| | | | | |
|---|---|---|---|---|
| 5,891,806 | A * | 4/1999 | Shibuya et al. | 438/707 |
| 6,710,854 | B1 * | 3/2004 | Shiraishi et al. | 355/67 |
| 6,864,959 | B1 * | 3/2005 | Shiraishi et al. | 355/67 |
| 6,968,850 | B1 * | 11/2005 | Chan et al. | 134/1.1 |
| 2004/0157136 | A1 * | 8/2004 | Chandhok et al. | 430/5 |
| 2005/0211918 | A1 * | 9/2005 | Oishi et al. | 250/491.1 |
| 2005/0244572 | A1 * | 11/2005 | Bristol et al. | 427/162 |
| 2006/0000985 | A1 * | 1/2006 | Chandhok et al. | 250/492.2 |
| 2006/0002113 | A1 * | 1/2006 | Chandhok et al. | 362/257 |

OTHER PUBLICATIONS

Hutcheson, G., "The First Nanochips," *Scientific American*, Apr. 2004, pp. 76-83.
Stix, G., "Getting More from Moore's," Scientific American.com, Apr. 17, 2001, 6 pgs.
Peele, Andrew G., "LIGA for lobster: First observation of lobster-eye focusing from lithographically produced optics," Review of Scientific Instruments, vol. 72, No. 3, Mar. 2001, pp. 1843-1849.
Peele, Andrew G., "Investigation of etched silicon wafers for lobster-eye optics," Review of Scientific Instruments, vol. 70, No. 2, Feb. 1999, pp. 1268-1273.
Peele, Andrew G., et al., "Lobster-eye all-sky monitors: A comparison of one- and two-dimensional designs," Review of Scientific Instruments, vol. 69, No. 7, Jul. 1998, pp. 2785-2793.

* cited by examiner

*Primary Examiner*—Nikita Wells
*Assistant Examiner*—Bernard E. Souw
(74) *Attorney, Agent, or Firm*—Blakely, Sokoloff, Taylor & Zafman LLP

(57) ABSTRACT

According to an embodiment of the invention, extreme ultraviolet (EUV) photolithography is performed using lobster eye transmission optics. A light source, such as a source plasma, is located at the center of a circle. Several mirror segments are arranged on an arc of the circle. The mirror segments may be arranged so that the light generated by the light source is collimated after being reflected. The light source may be a source plasma capable of generating EUV photons.

23 Claims, 6 Drawing Sheets

100

200

300

500

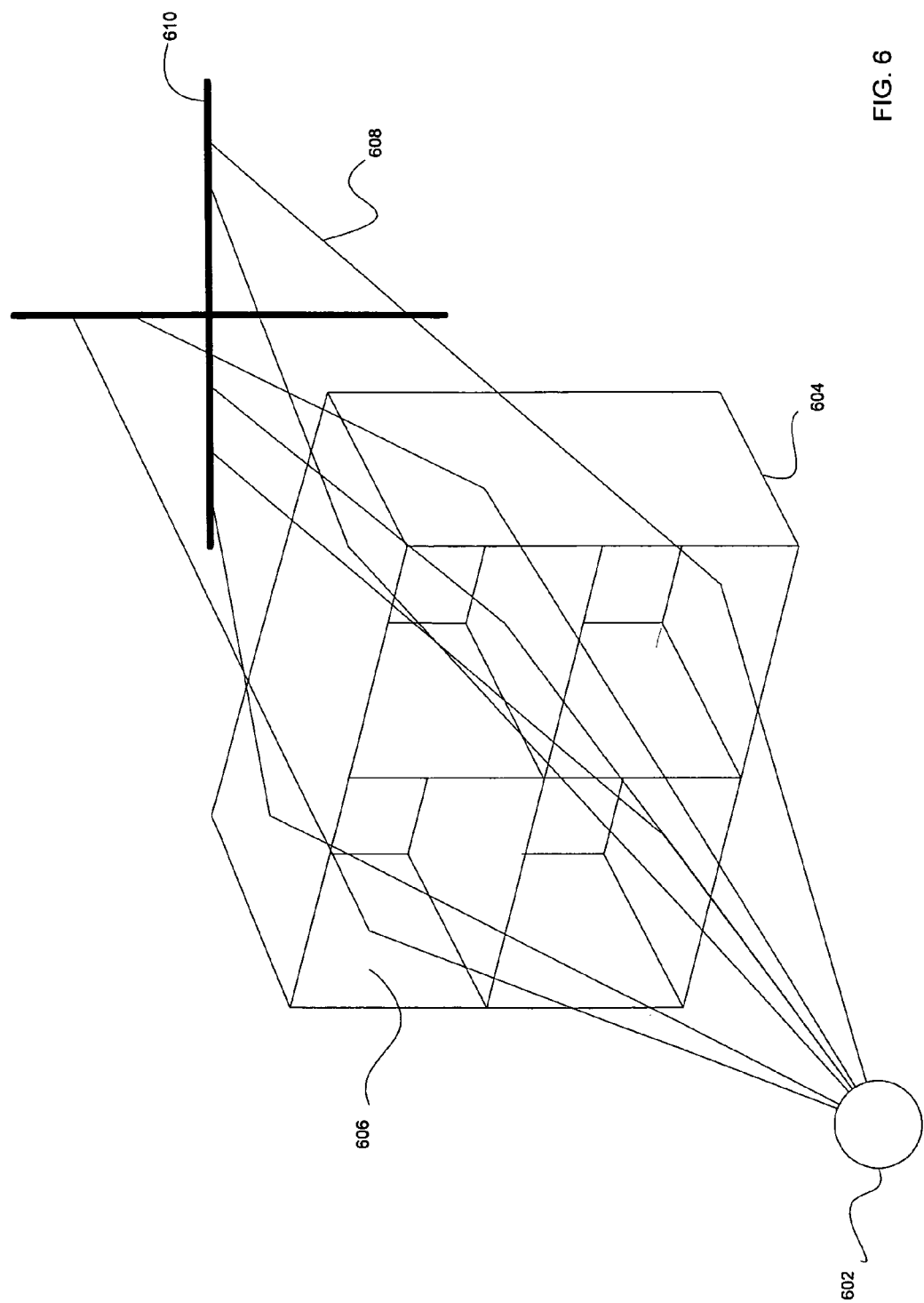

OPTICS FOR EXTREME ULTRAVIOLET LITHOGRAPHY

FIELD OF THE INVENTION

The present invention generally relates to semiconductor processing, and specifically to using lobster eye optics for extreme ultraviolet photolithography.

BACKGROUND

Integrated Circuits (ICs) generally comprise many semiconductor features, such as transistors, formed on a semiconductor substrate. The patterns used to form the devices may be defined using a process known as photolithography. Using photolithography, light is shone through a pattern on a mask, transferring the pattern to a layer of photoresist on the semiconductor substrate. The photoresist can then be developed, removing the exposed photoresist and leaving the pattern on the substrate. Various other techniques, such as ion implantation, etching, etc. can then be performed to form the individual devices.

To increase the speed of ICs such as microprocessors, more and more transistors are added to the ICs. Therefore, the size of the individual devices must be reduced. One way to reduce the size of individual features is to use short wavelength light during the photolithography process. According to Raleigh's Law ($R = k*\lambda/NA$, where k is a constant, and NA=Numerical Aperture, and R is the resolution of features), a reduction in the wavelength of the light proportionately reduces the size of printed features.

Extreme ultraviolet (EUV) light (13.5 nm) is now being used to print very small semiconductor features. For example, EUV can be used to print isolated features that are 15–20 nanometers (nm) in length, and nested features and group structures that have 50 nm line space. EUV lithography is targeted to meet the requirements of a 50 nm half-pitch, where pitch is equal to line plus feature size.

Since EUV light has such a short wavelength, it is easily absorbed, even by air. Therefore, for EUV photolithography to be viable, mirrors are used for focusing rather than lenses. The mirrors used for focusing need to have a high reflectivity since the transmission rate of EUV light is low.

EUV photons can be generated by creating a dense plasma. One way to generate the photons is to project a laser beam into a target (droplet, or filament) which produces the plasma, heating it, and thereby exciting the atoms. When the excited atoms return to a stable state, photons of a certain energy, and thereby a certain wavelength, are emitted. The target may be, for example, Xenon, Tin, or Lithium. Another way to produce EUV photons is to use an arc lamp producing a high temperature between two electrodes having the plasma between the two electrodes.

Typical EUV optics include a set of mirrors to focus light generated by a light source, an obscuration in front of the light source to block debris generated by the light source, a condenser, and a reticle. The EUV light source generates EUV photons, which are reflected by the mirrors and directed through the condenser. The condenser typically includes a collimator to collimate the incoming light. The light is then directed through a reticle, which includes the pattern to be lithographed on a substrate.

The set of mirrors typically comprises an array of mirrors including two separate segments. The light is reflected off of the first segment, and then off of the second segment to focus the light. Each segment absorbs a percentage of the generated light. For example, if the reflectivity of each segment is 70%, when the light is reflected by both segments, only 49% of the incident light is transmitted by the mirrors.

The obscuration is typically a foil disc placed in front of the EUV light source to block debris created by Brownian motion. The obscuration also absorbs a large portion of the light generated by the EUV light source. Further, the collimator also absorbs a portion of the light.

BRIEF DESCRIPTION OF THE DRAWINGS

One or more embodiments of the present invention are illustrated by way of example and not limitation in the figures of the accompanying drawings, in which like references indicate similar elements and in which:

FIG. 6 is a perspective view of two-dimensional lobster-eye optics.

DETAILED DESCRIPTION

Described herein are Optics For Extreme Ultraviolet Lithography. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to one embodiment of the invention, a one bounce mirror arrangement utilizing lobster eye optics is used for Extreme Ultraviolet (EUV) photolithography. The lobster eye design includes several grazing incidence mirrors arranged along an arc of a circle having the source plasma at the center. According to one embodiment, the light is automatically collimated, thereby eliminating the need for a collimator, while only reflecting the incident light once, thereby increasing the transmission of the light. Foil trap elements are attached to each mirror segment to protect each mirror from debris produced by the source plasma.

Lobster eye optics are used in astronomy in telescopes to collect incoming light rays and focus them at a point. According to an embodiment of the invention, the lobster eye optics can be used in reverse for photolithography. The light source is placed at the focus of the optics, and light is distributed through the optics.

Figure 1:
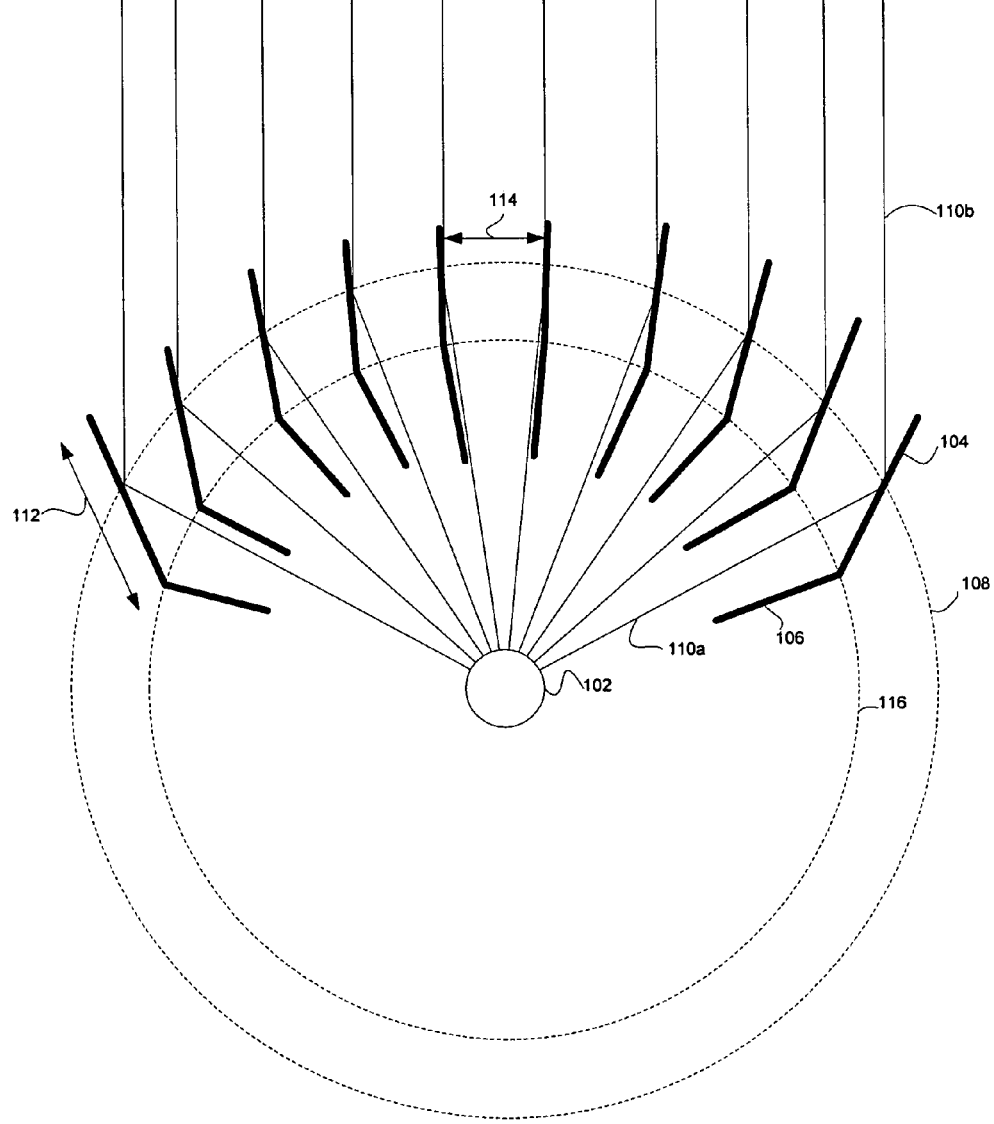
FIG. 1 is a cross-sectional overhead view of lobster eye optics for photolithography according to an embodiment of the invention.

FIG. 1 illustrates lobster eye optics for photolithography according to an embodiment of the invention. The optics 100 include a light source such as a source plasma 102, an array of mirrors including several mirror segments 104, and several foil trap elements 106 attached to the mirror segments 104. The mirror segments 104 are positioned on an arc of a circle 108 having the source plasma 102 at the center of the circle 108. The source plasma 102 generates debris because of Brownian movement. The foil trap elements 106 block debris generated by the source plasma 102. Previously, a foil obscuration was placed in front of the source plasma to block the debris. The obscuration was typically a disc, and the obscuration absorbed a large portion of the light energy generated by the source plasma 102.

According to one embodiment, outgoing light rays 110 are collimated. Previously, a collimator was included in a condenser which was located after the optics. Using the optics 100, the collimator in the prior condenser is not needed, increasing the proportion of generated light that is transmitted. Further, since the circular obscuration is not needed, more light is transmitted. The obscuration blocks up to 20% of the photons generated by the source plasma. Also, since the rays 110a are only reflected once, more light is transmitted. For example, if the mirrors 104 have a reflectivity of 0.7, the ray 110b has 70% of the energy of the ray 110a. By comparison, using two mirrors as in the prior art, if both mirrors had a reflectivity of 0.7, only 49% of the generated light would be transmitted.

As described above, the source plasma 102 may generate EUV photons by exciting a plasma including xenon, tin, lithium, etc. atoms. The plasma may be excited by shining a laser upon it, or by producing an arc across two electrodes having a plasma disposed in between. The source plasma 102 emits photons in all directions. Therefore, by using lobster eye optics 102, more of the EUV photons can be captured and directed toward a layer of photoresist on a semiconductor substrate.

The mirror segments 104 may be planar according to one embodiment of the invention. The mirror segments 104 may also be curved, as necessary, to generate the proper distribution of light. According to another embodiment of the invention, the outgoing light rays 110b are focusing rather than collimating, and the mirror segments 104 may be curved as necessary. The mirror segments 104 may be oriented either horizontally or vertically, depending on the requirements of the application.

The mirror segments 104 may be grazing incidence mirrors designed to reflect light incident at grazing angles. The mirrors may comprise multi-layer mirrors including several Molybdenum and Silicon layers. The mirrors may be tailored by including different layers. For example, the Molybdenum layers exhibit high absorption, while the Silicon layers exhibit high reflectivity.

In order to maintain uniform light distribution, mirror segments 104 near the center of the array of mirrors may have increased roughness to reduce reflectivity. Since the rays 110a are incident upon the mirror segments 104 at smaller angles near the center of the array, and since more light is transmitted when the angle relative to the plane of the mirror segment 104 is smaller, mirror segments 104 near the center of the array can be made more rough to compensate for their inherent greater transmission rate. The inherent reflectivity of the mirror segments 104 near the center of the array is thereby balanced with reflectivity based on the incident grazing angle so that each mirror transmits roughly the same amount of light.

According to an embodiment of the invention, the mirror segments have a length 112 of between 2 and 3 centimeters (cm), and the circle 108 on which they are located may have a radius of between 10 cm and 1 meter (m). Generally, the further the mirror segments 104 are located from the source plasma 102, the more light is collected and transmitted. However, the number of mirror segments 104 required increases exponentially as the distance from the source 102 increases. Alternatively, the closer the mirror segments 104 are to the source plasma 102, the more heat and debris the segments 104 are exposed to.

Also according to this embodiment, the mirror segments have a distance 114 between them that is between one-tenth and one-one-hundredth the length 112 of the mirror segments 104. For example, if the length 112 is 2 cm, the distance 114 would be between 0.2 millimeters (mm) and 2 mm. Accordingly, the larger the circle 108, the more mirror segments 104 that will be required. The gaps between the mirror segments 104 may be chosen to maximize transmitted light. It is understood that these dimensions are used as examples of an embodiment of the invention, and that one skilled in the art would understand that several alternative constructions may be used.

The foil trap elements 106 replace the obscuration of the prior art. According to one embodiment of the invention, the foil trap elements are located on an inner circle 116, and along a radius of the circle 116. Brownian movement causes the source plasma 102 to emit debris. The debris travels randomly, so the orientation of the foil trap elements 106 protects the mirror segments 104 while still allowing the rays 110a to strike the mirror segments 104 at an appropriate angle. The foil trap elements 106 may comprise gold or another foil material appropriate for trapping the debris.

Figure 2:
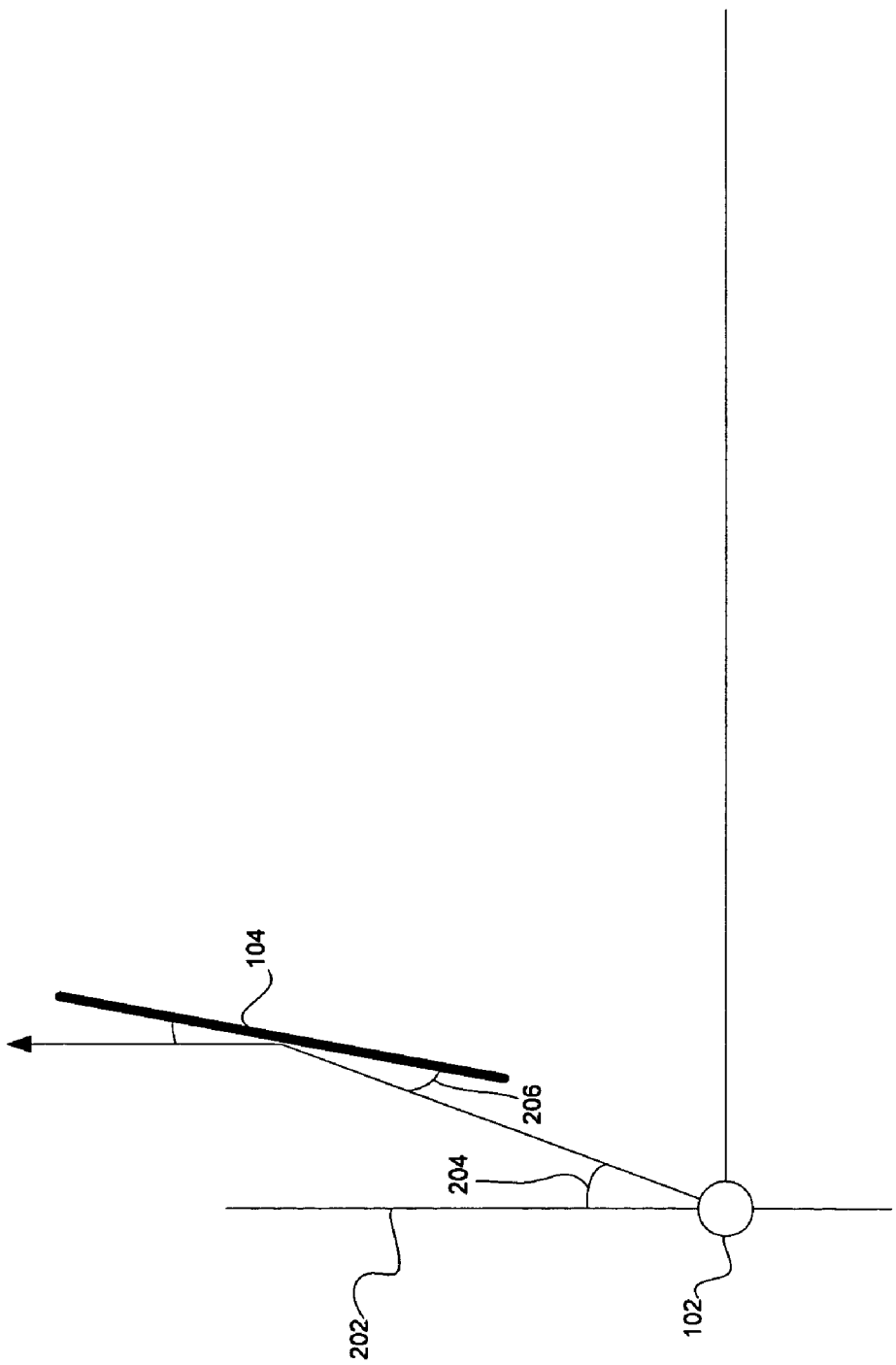
FIG. 2 is a cross-sectional overhead view of a portion of the lobster eye optics, showing positioning of mirror segments.

FIG. 2 illustrates the positioning of the mirror segments 104. More light is reflected by a mirror when the light grazes the mirror. In other words, when a light ray is incident normal to a mirror, the transmission of the mirror is at its lowest. When a light ray grazes a mirror at a very small angle, the transmission is at its highest. FIG. 2 illustrates how the positioning of the mirrors affects transmission. According to an embodiment of the invention, the mirror segments 104 are only placed along an arc of the circle 108 large enough so that all of the segments 104 have a grazing incidence angle of 10° or less.

The following example assumes that a Rhodium coated mirror having 82% reflectivity is used. It is understood that other figures may be generated for other mirror types. A normal 202 is parallel to the outgoing rays 110b. According to one embodiment, in order to maintain sufficient illumination, the mirror segments 104 are positioned along an arc of the circle 108 so that only light in a range within an angle 204 that is 20° off the normal 202 is transmitted. According to this embodiment, the incoming ray 110a should be incident upon the mirror segment 104 at an angle 206 of no more than 10°. As mentioned above, reflectivity varies based on the incident angle of the incoming light. For the sample mirror, an incident angle 206 of 10° produces the smallest acceptable reflectivity. Therefore, the end of the arc on which the array of mirrors is positioned is chosen so that the incoming rays 110a are incident at the angle 206 of no more than 10°. As a result, the total solid angle of light collected is $0.68\pi$ steradians. It is understood that various different mirror configurations may be used, and that this example only explains a process for positioning the mirror segments 104 based on the desired characteristics of the system.

Figure 3:
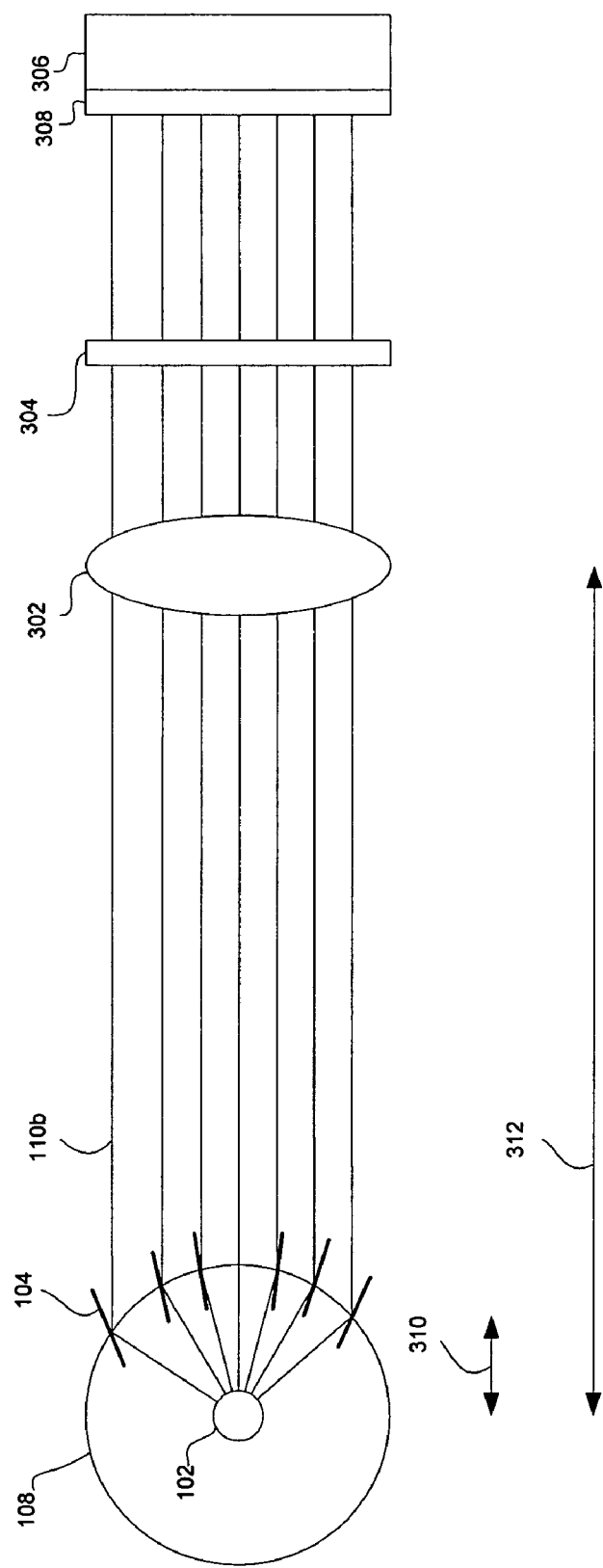
FIG. 3 is a side view of a system for performing photolithography using lobster-eye optics.

FIG. 3 illustrates a system for performing photolithography using lobster-eye optics. The lobster eye optics 100 project reflected light rays 110b toward a condenser 302. The condenser 302 performs functions such as spreading out the incident rays 110b, and shaping an exposed region (e.g., an arc-shaped region). According to one embodiment of the invention, the condenser 302 does not need a collimator, since the outgoing light 110b is collimated by the lobster eye optics 100. However, according to an alternate embodiment of the invention, the light from the lobster eye optics 100 is focused, and a collimator may be included in the condenser 302.

After the light rays 110b pass through the condenser 302, they pass through a reticle 304, which includes the pattern being created on a semiconductor substrate 306. The reticle 304 may also be referred to as a mask, since the reticle 304 "masks" some of the incoming light rays 110b, only allowing certain areas of a substrate 306 to be exposed. The reticle 304 may be reflective to increase light transmission. The semiconductor substrate 306 has a layer of photoresist 308 deposited over it. When the light rays 110b strike the photoresist 308, it is exposed, and can be developed, to remove a portion of the photoresist and reveal a portion of the underlying substrate 306. Further operations, such as etching, ion implantation, annealing, etc., can then be performed to the exposed substrate. These processes may eventually result in semiconductor devices, such as transistors, or metallization layers being formed on the semiconductor substrate 306.

As mentioned above, the distance 310 between the source plasma 102 and the mirror segments 104 may be between 1 and 10 cm. The track length 312 between the source plasma 102 and the other optical elements, such as the condenser 302, may be on the order of 1.5 m. Other dimensions may be chosen, according to the needs of the specific application.

Figure 4:
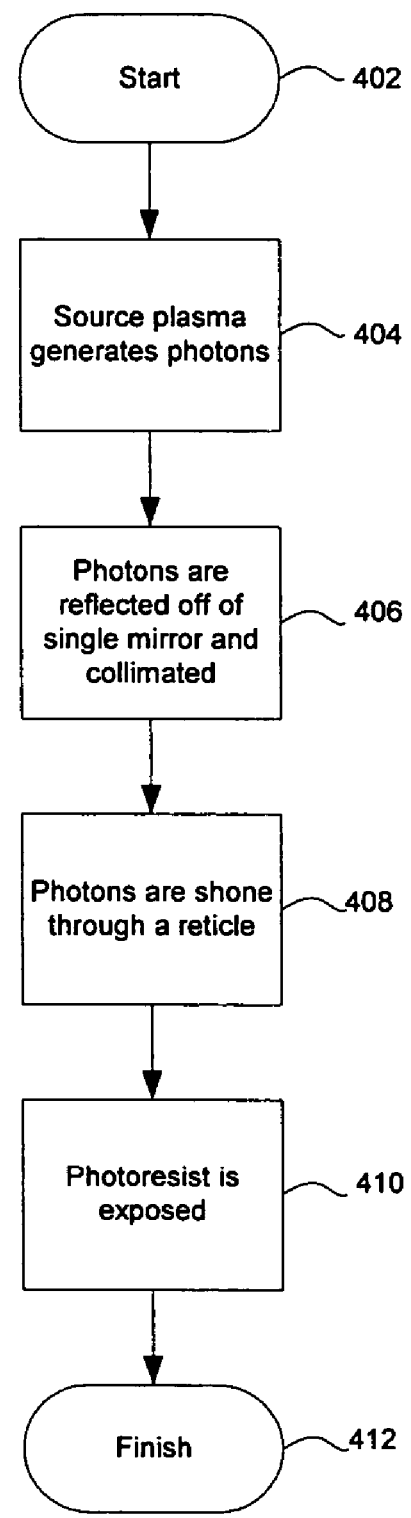
FIG. 4 is a flowchart describing a process of using the lobster eye optics according to an embodiment of the invention.

FIG. 4 is a flowchart describing a process of using the lobster eye optics according to an embodiment of the invention. The process 400 begins in start block 402. In block 404, a light source, such as a source plasma, generates EUV photons. As mentioned above, the photons may be generated by exciting atoms in a plasma, causing an emission of photons when the atoms return to their stable state. In block 406, the photons are reflected off of an array of single mirrors, as described above. The photons may also be collimated. The mirror array is a lobster eye array, including several mirror segments positioned along an arc of a circle having the light source at its center. In block 408, the photons are shone through a reticle. The reticle includes a pattern to be transferred to a photoresist layer on a semiconductor substrate. In block 410, a portion of the photoresist layer is exposed through the reticle. In block 412, the process is finished.

Figure 5:
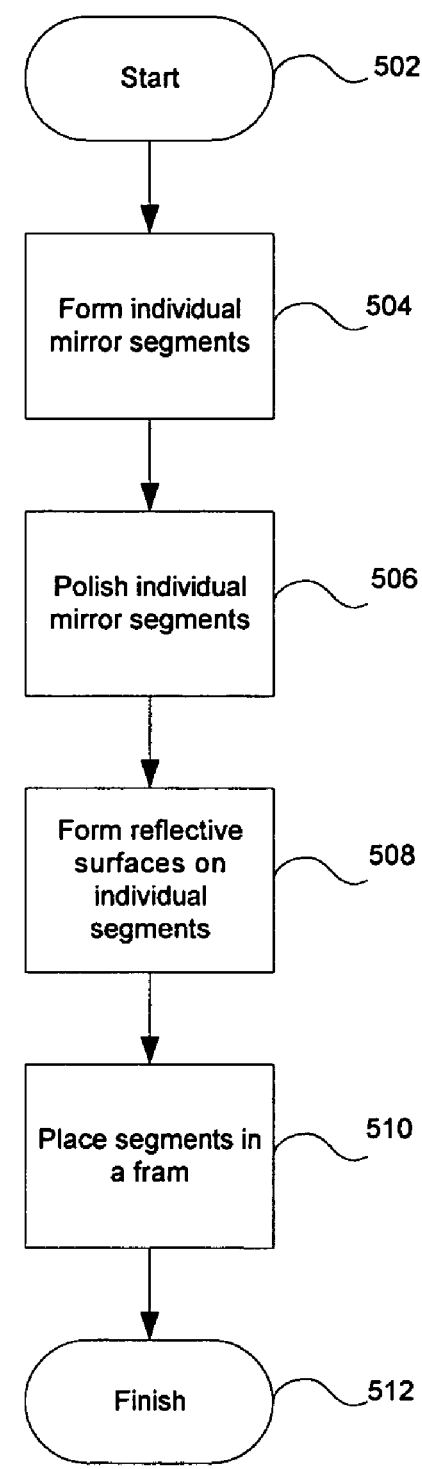
FIG. 5 is a flowchart describing a process for forming mirrors to be used with embodiments of the invention.

FIG. 5 is a flowchart describing a process for forming mirrors to be used with embodiments of the invention. The process 500 beings in start block 502. In block 504, the individual mirror segments are formed. The mirror segments can be formed using any of several techniques. According to one technique, the mirrors are electroformed onto a master mandrel. The mirrors may also be cut from thin (10 micron) wafers and bonded to a slightly curved substrate. Other processes for forming mirror segments can also be used.

In block 506, the individual mirror segments are coated to form the reflective surface. For example, several layers of silicon or molybdenum can be alternatively formed on the segments. In block 508, the mirror segments may be polished to tailor their reflectivity. For example, as mentioned above, the segments to be used near the center of the arc of the array can be intentionally roughened to reduce their reflectivity to improve the uniformity of the outputted light.

In block 510, the mirror segments are placed in a frame. The frame holds the segments in position for the lithographic process. The segments are arranged as described regarding FIGS. 1 and 2. In block 512, the process 500 is finished.

Several additional processes may be performed upon the mirror segments if desired. For example, since cooling may be important, the mirror segments could have micro-cooling channels etched in the back of the individual segments. Also, using anisotropic etching, highly efficient gratings could be formed in the silicon layers to eliminate out-of-band radiation, thereby eliminating the need for a downstream element to perform this task.

FIG. 6 illustrates two-dimensional lobster-eye optics. The two-dimensional lobster-eye optics 600 may be used in place of the one-dimensional optics 100 according to an alternate embodiment of the invention. The optics 600 include a source plasma 602, and a two dimensional mirror array 604. The array includes several individual curved mirror segments 606, which may be spherical. The array 604 would therefore be boxes slumped on a sphere. The rays 608 generated by the source plasma 602 are focused on a cross 610. This light is parallel to the optical axis and is collimated.

The two-dimensional optics 600 may be used in the same fashion that the one-dimensional optics 100, described above, were. The light focused on the cross 610 can be directed through a collimator, and a reticle, and onto a layer of photoresist, which is then developed.

This invention has been described with reference to specific exemplary embodiments thereof. It will, however, be evident to persons having the benefit of this disclosure that various modifications changes may be made to these embodiments without departing from the broader spirit and scope of the invention. The specification and drawings are accordingly to be regarded in an illustrative rather than in a restrictive sense.

What is claimed is:

1. A system for performing photolithography comprising:
   a light source to generate photons;
   a reticle to mask the photons and expose a pattern onto a layer of photoresist; and
   an array of mirrors mounted along an arc of a circle surrounding the light source, the mirrors are positioned to collimate the photons generated by the light source and direct the photons through the reticle onto the layer of photoresist.

2. The system of claim 1, wherein the light source comprises an extreme ultraviolet (EUV) light source.

3. The system of claim 2, wherein the EUV light source comprises an excited plasma.

4. The system of claim 3, wherein the plasma is chosen from the group consisting of Xenon, Tin, and Lithium.

5. The system of claim 1, wherein the mirrors comprise plane mirrors.

6. The system of claim 3, further comprising a set of foil trap elements mounted to each mirror to trap debris generated by the light source.

7. The system of claim 6, wherein the foil trap elements are positioned to avoid obscuring the light.

8. The system of claim 7, wherein the foil trap elements are positioned parallel to incident rays of light.

9. The system of claim 1, wherein the radius of the circle is between 10 centimeters (cm) and 1 meter.

10. The system of claim 1, wherein mirrors positioned near a center of the arc are less reflective than mirrors positioned near an edge of the arc.

11. A system for performing photolithography comprising:
    a light source;

an array of mirrors to reflect light generated by the light source, the mirrors are positioned about a circle having a center, wherein the light source is located at the center of the circle;

a condenser to receive the light reflected by the mirrors; and a reticle to mask the light reflected by the mirrors and directed through the condenser.

12. The system of claim 11, wherein the light source is an excited plasma generating EUV photons.

13. The system of claim 12, further comprising a set of foil trap elements mounted to an end of each of the array of mirrors to block debris generated by the light source.

14. The system of claim 11, wherein the reticle is reflective.

15. The system of claim 13, wherein the foil trap elements are positioned along a radius of the circle.

16. The system of claim 11, wherein the light is collimated by the array of mirrors.

17. The system of claim 11, wherein the array of mirrors are positioned along an arc of the circle, and wherein the arc is defined through an angle at which the reflectivity of a mirror at an end of the arc is at a minimum value.

18. A method for performing photolithography comprising:

generating photons using a light source;

reflecting the photons with an array of mirrors positioned on a circle having a center, wherein the light source is located at the center of the circle;

masking the reflected photons using a reticle; and exposing a photoresist layer with the photons.

19. The method of claim 18, wherein generating photons using a light source comprises:

generating extreme ultraviolet (EUV) photons using an excited plasma.

20. The method of claim 18, wherein reflecting the photons comprises reflecting the photons using an array of mirrors comprising plane mirrors.

21. The method of claim 18, wherein masking the reflected photons comprises masking the reflected photons using a reflective reticle.

22. The method of claim 18, further comprising:

developing the photoresist after exposing the photoresist.

23. The method of claim 19, wherein generating EUV photons comprises:

activating an electrode having a plasma disposed therein to excite the plasma and generate the EUV photons.

* * * * *